United States Patent
DeBoer et al.

(10) Patent No.: US 6,737,696 B1
(45) Date of Patent: *May 18, 2004

(54) DRAM CAPACITOR FORMULATION USING A DOUBLE-SIDED ELECTRODE

(75) Inventors: Scott J. DeBoer, Boise, ID (US); Husam Al-Shareef, Boise, ID (US); Randhir Thakur, Cupertino, CA (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/089,445

(22) Filed: Jun. 3, 1998

(51) Int. Cl.[7] .................... H01L 27/108; H01L 29/76; H01L 29/94; H01L 31/119
(52) U.S. Cl. ........................... 257/306; 257/309
(58) Field of Search ................ 257/295–313, 257/532–535; 438/243–255, 396–399

(56) References Cited

U.S. PATENT DOCUMENTS

| 5,278,091 A | 1/1994 | Fazan et al. | |
| 5,340,765 A | 8/1994 | Dennison et al. | |
| 5,362,632 A | 11/1994 | Matthews | |
| 5,612,574 A | * 3/1997 | Summerfelt et al. | 257/295 |
| 5,627,094 A | 5/1997 | Chan et al. | |
| 5,741,722 A | * 4/1998 | Lee | 438/396 |
| 5,786,250 A | * 7/1998 | Wu et al. | 438/254 |
| 5,817,555 A | * 10/1998 | Cho | 438/253 |
| 5,960,294 A | * 9/1999 | Zahurak et al. | 438/398 |
| 5,973,351 A | * 10/1999 | Kotecki et al. | 257/310 |

* cited by examiner

Primary Examiner—Cuong Nguyen
(74) Attorney, Agent, or Firm—Dickstein Shapiro Morin & Oshinsky LLP

(57) ABSTRACT

A capacitor having a double sided electrode for enhanced capacitance. In one embodiment, the double sided electrode capacitor is a stacked container capacitor used in a dynamic random access memory circuit. The double sided electrode is preferably formed of a conductive metal, provided that an oxide of the metal is conductive. The double sided electrode capacitor provides a capacitor that has high storage capacitance which provides an increased efficiency for a cell without an increase in the size of the cell.

33 Claims, 20 Drawing Sheets

DRAM CAPACITOR FORMULATION USING A DOUBLE-SIDED ELECTRODE

FIELD OF THE INVENTION

The invention relates generally to integrated circuits and more particularly to a double sided lower electrode capacitor for use in an integrated circuit.

BACKGROUND OF THE INVENTION

Capacitors are used in a wide variety of semiconductor circuits. Capacitors are of special concern in DRAM (dynamic random access memory) memory circuits; therefore, the invention will be discussed in connection with DRAM memory circuits. However, the invention has broader applicability and is not limited to DRAM memory circuits. It may be used in any other type of memory circuit, such as an SRAM (static random access memory), as well as in any other circuit in which capacitors are used.

DRAM memory circuits are manufactured by replicating millions of identical circuit elements, known as DRAM cells, on a single semiconductor wafer. A DRAM cell is an addressable location that can store one bit (binary digit) of data. In its most common form, a DRAM cell consists of two circuit components: a storage capacitor and an access field effect transistor.

FIG. 1 illustrates a portion of a DRAM memory circuit containing two neighboring DRAM cells 10. For each cell, one side of the storage capacitor 14 is connected to a reference voltage, which is typically one half of the internal operating voltage (the voltage corresponding to a logical "1" signal) of the circuit. The other side of the storage capacitor 14 is connected to the drain of the access field effect transistor 12. The gate of the access field effect transistor 12 is connected to a signal referred to as the word line 18. The source of the field effect transistor 12 is connected to a signal referred to as the bit line 16. With the circuit connected in this manner, it is apparent that the word line controls access to the storage capacitor 14 by allowing or preventing the signal (a logic "0" or a logic "1") on the bit line 16 to be written to or read from the storage capacitor 14.

The manufacturing of a DRAM cell includes the fabrication of a transistor, a capacitor, and three contacts: one each to the bit line, the word line, and the reference voltage. DRAM manufacturing is a highly competitive business. There is continuous pressure to decrease the size of individual cells and increase memory cell density to allow more memory to be squeezed onto a single memory chip. However, it is necessary to maintain a sufficiently high storage capacitance to maintain a charge at the refresh rates currently in use even as cell size continues to shrink. This requirement has led DRAM manufacturers to turn to three dimensional capacitor designs, including trench and stacked capacitors. Stacked capacitors are capacitors which are stacked, or placed, over the access transistor in a semiconductor device. In contrast, trench capacitors are formed in the wafer substrate beneath the transistor. For reasons including ease of fabrication and increased capacitance, most manufacturers of DRAMs larger than 4 Megabits use stacked capacitors. Therefore, the invention will be discussed in connection with stacked capacitors but should not be understood to be limited thereto. For example, use of the invention in trench or planar capacitors is also possible.

One widely used type of stacked capacitor is known as a container capacitor. Known container capacitors are in the shape of an upstanding tube (cylinder) having an oval or circular cross section. FIG. 2 illustrates a top view of a portion of a DRAM memory circuit from which the upper layers have been removed to reveal container capacitors 14 arranged around a bit line contact 16. Six container capacitors 14 are shown in FIG. 2, each of which has been labeled with separate reference designations A to F. Recall from FIG. 1 that the bit lines of neighboring DRAM cells are electrically connected. To increase density, bit line contacts are shared by neighboring DRAM cells. In FIG. 2, the bit line contact 16 is shared by DRAM cells corresponding to container capacitors A and B. The wall of each tube consists of two plates of conductive material such as doped polycrystalline silicon (referred to herein as polysilicon or poly) separated by a dielectric. A preferred dielectric is tantalum pentoxide ($Ta_2O_5$). The bottom end of the tube is closed, with the outer wall in contact with either the drain of the access transistor or a plug which itself is in contact with the drain. The other end of the tube is open (the tube is filled with an insulative material later in the fabrication process). The sidewall and closed end of the tube form a container; hence the name "container capacitor." Although the invention will be further discussed in connection with stacked container capacitors, the invention should not be understood to be limited thereto.

The electrodes in a DRAM cell capacitor must be conductive, and must protect the dielectric film from interaction with interlayer dielectrics (e.g., BPSG) and from the harsh thermal processing encountered in subsequent steps of DRAM process flow. For example, $Ta_2O_5$ dielectrics may be used for high density DRAMs, such as 64 Mbit and 256 Mbit DRAMs, because chemical vapor deposition (CVD) of $Ta_2O_5$ provides a high dielectric constant (about 20–25) and good step coverage. However, when rapid thermal processed nitride (RTN) is formed over a layer of hemispherical grain polysilicon (HSG) to serve as an HSG barrier layer to prevent oxidation of HSG during subsequent $Ta_2O_5$ deposition, there is a capacitance loss due to the RTN layer on the capacitor electrode. The effective dielectric constant for an RTN/$Ta_2O_5$ stack capacitor is about 10–12.

Several methods have been attempted to increase capacitance, including depositing HSG inside a container capacitor together with a smooth polysilicon deposited on the outside of the container, depositing a smooth metal on both the inside and outside of the capacitor, and depositing a double sided HSG. The present invention has advantages over the previous methods in that the HSG inside with smooth polysilicon outside capacitors, and the smooth metal capacitors, have lower capacitance and do not achieve the superior results of the present invention. Regarding the double sided HSG capacitor, the present invention also overcomes the difficulties involved in using HSG on the outside of a capacitor plate, and the resulting in short circuits between containers and defects in the capacitor.

As memory cell density continues to increase, there is needed a capacitor that has an increased effective capacitance per cell. The present invention provides a fabrication process and capacitor structure that achieves high storage capacitance without increasing the frequency of capacitor defects or the size of the capacitor.

SUMMARY OF THE INVENTION

The present invention provides a double sided electrode capacitor formed of a metal electrode that preferably has an additional conductive layer, preferably HSG, on one side, together with a silica nitride coating dielectric, and a dielectric material such as $Ta_2O_5$ on another side, as shown, for example, in FIG. 3.

DETAILED DESCRIPTION OF THE PREFERRED EMBODIMENTS

An exemplary construction of a fabrication process for a container capacitor according to one embodiment of the present invention is described below. It is to be understood, however, that this process is only one example of many possible processes. For example, the bit line is formed over the capacitor in the following process. A buried bit-line process could also be used. As another example, the plugs under the capacitors formed by the following process could be eliminated. Also, dry or wet etching could be used rather than chemical mechanical polishing. The invention is not intended to be limited by the particular process described below.

Figure 4:
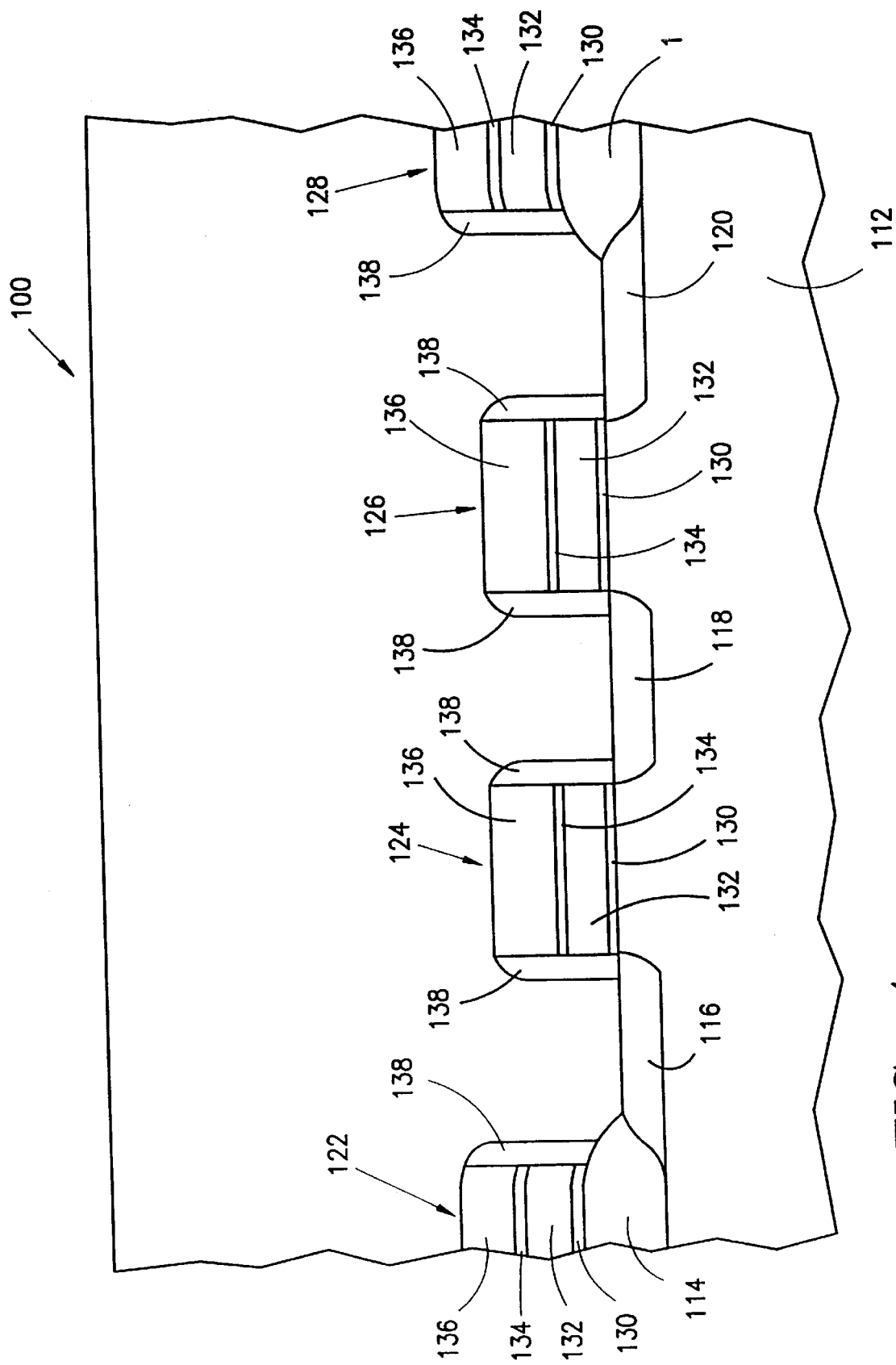
FIG. 4 is a diagrammatic cross-sectional view of a portion of a semiconductor wafer at an early processing step according to one embodiment of the present invention.

Referring now to FIG. 4, a semiconductor wafer fragment at an early processing step is indicated generally by reference numeral 100. The semiconductor wafer 100 is comprised of a bulk silicon substrate 112 with field isolation oxide regions 114 and active areas 116, 118, 120 formed therein. Word lines 122, 124, 126, 128 have been constructed on the wafer 100 in a conventional manner. Each word line consists of a lower gate oxide 130, a lower poly layer 132, a higher conductivity silicide layer 134 and an insulating silicon nitride cap 136. Each word line has also been provided with insulating spacers 138, which are also composed of silicon nitride.

Two FETs are depicted in FIG. 4. One FET is comprised of two active areas (source/drain) 116, 118 and one word line (gate) 124. The second FET is comprised of two active areas (source/drain) 118, 120 and a second word line (gate) 126. The active area 118 common to both FETs is the active area over which a bit line contact will be formed. As discussed above, one bit line contact is shared by two DRAM cells to conserve space.

Figure 5:
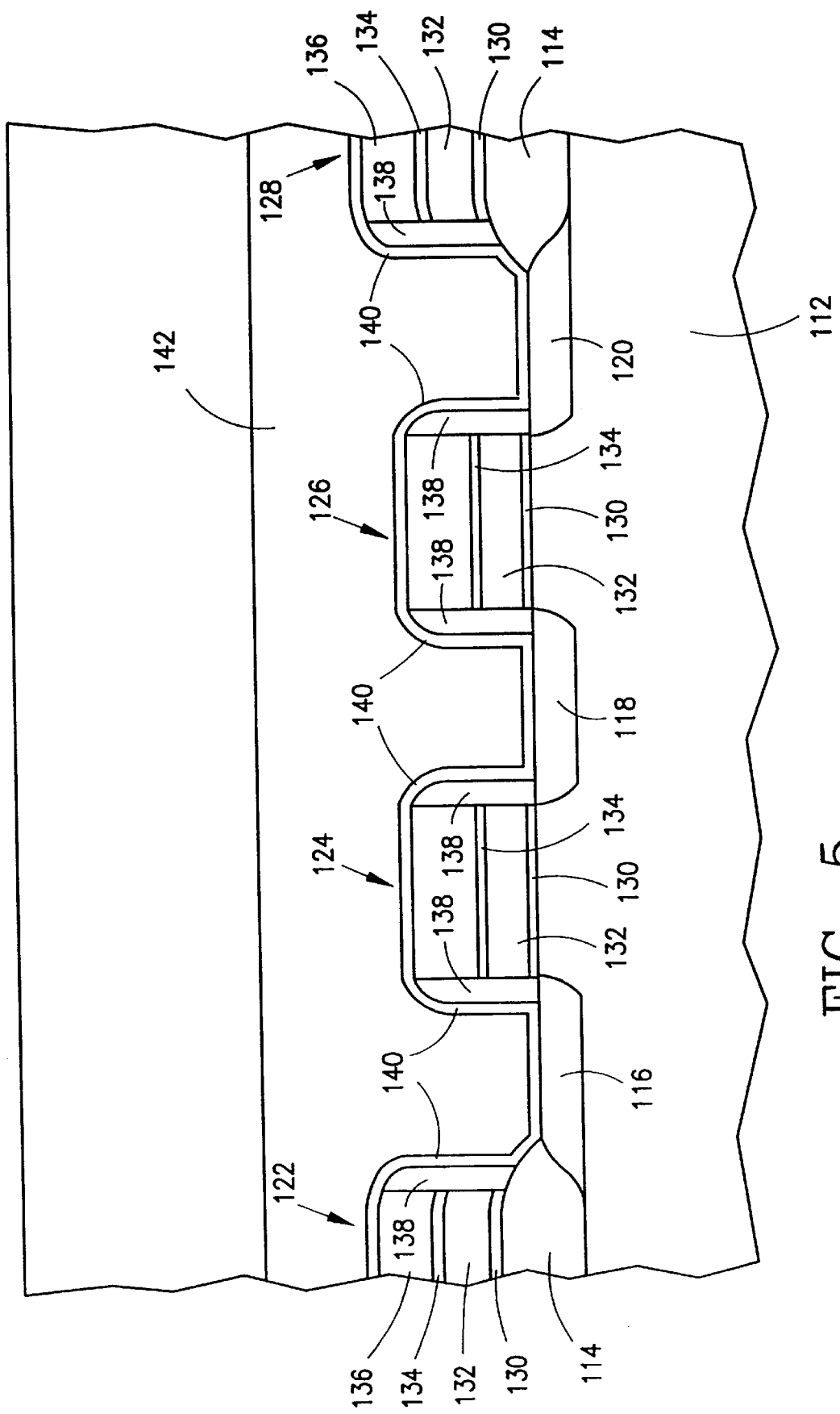
FIG. 5 is a diagrammatic cross-sectional view of a portion of a semiconductor wafer at a processing step subsequent to that shown in FIG. 4.

Referring now to FIG. 5, a thin layer 140 of nitride or TEOS (tetraethyl orthosilicate) is then provided atop the wafer 100. Next a layer of insulating material 142 is deposited. The insulating material preferably consists of borophosphosilicate glass (BPSG). The insulating layer 142 is subsequently planarized by chemical-mechanical polishing (CMP).

Figure 6:
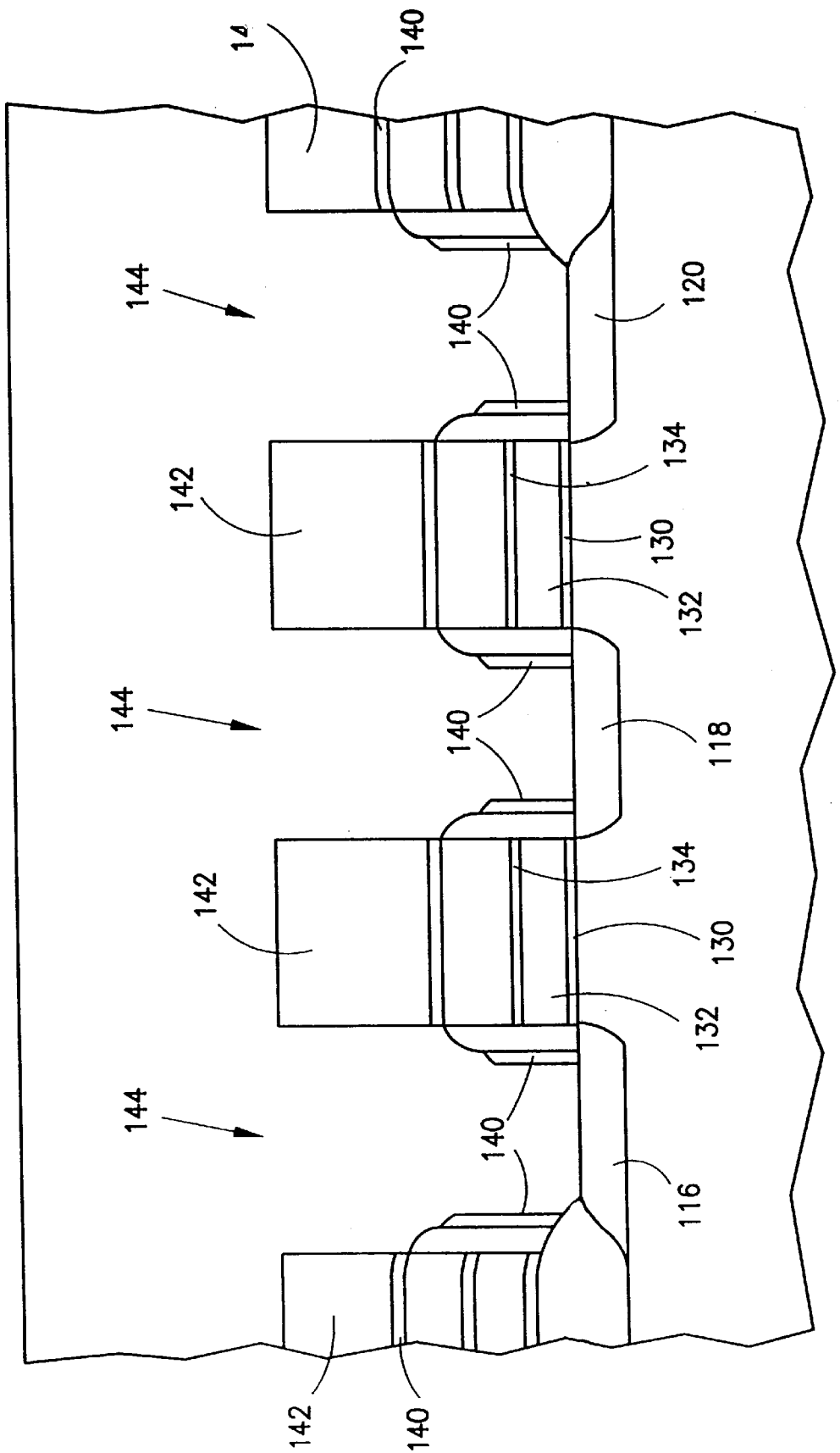
FIG. 6 is a diagrammatic cross-sectional view of a portion of a semiconductor wafer at a processing step subsequent to that shown in FIG. 5.
Figure 7:
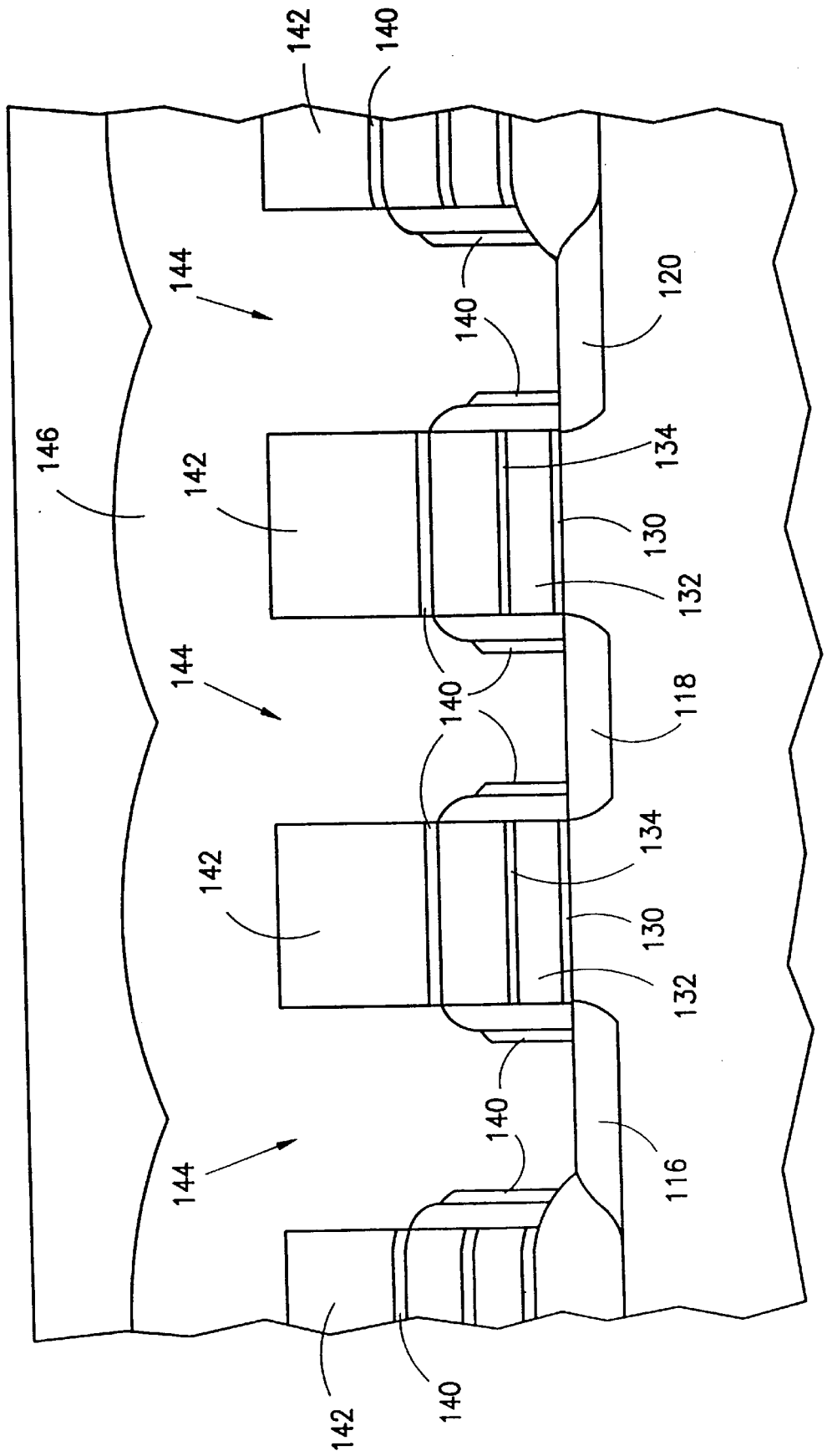
FIG. 7 is a diagrammatic cross-sectional view of a portion of a semiconductor wafer at a processing step subsequent to that shown in FIG. 6.
Figure 8:
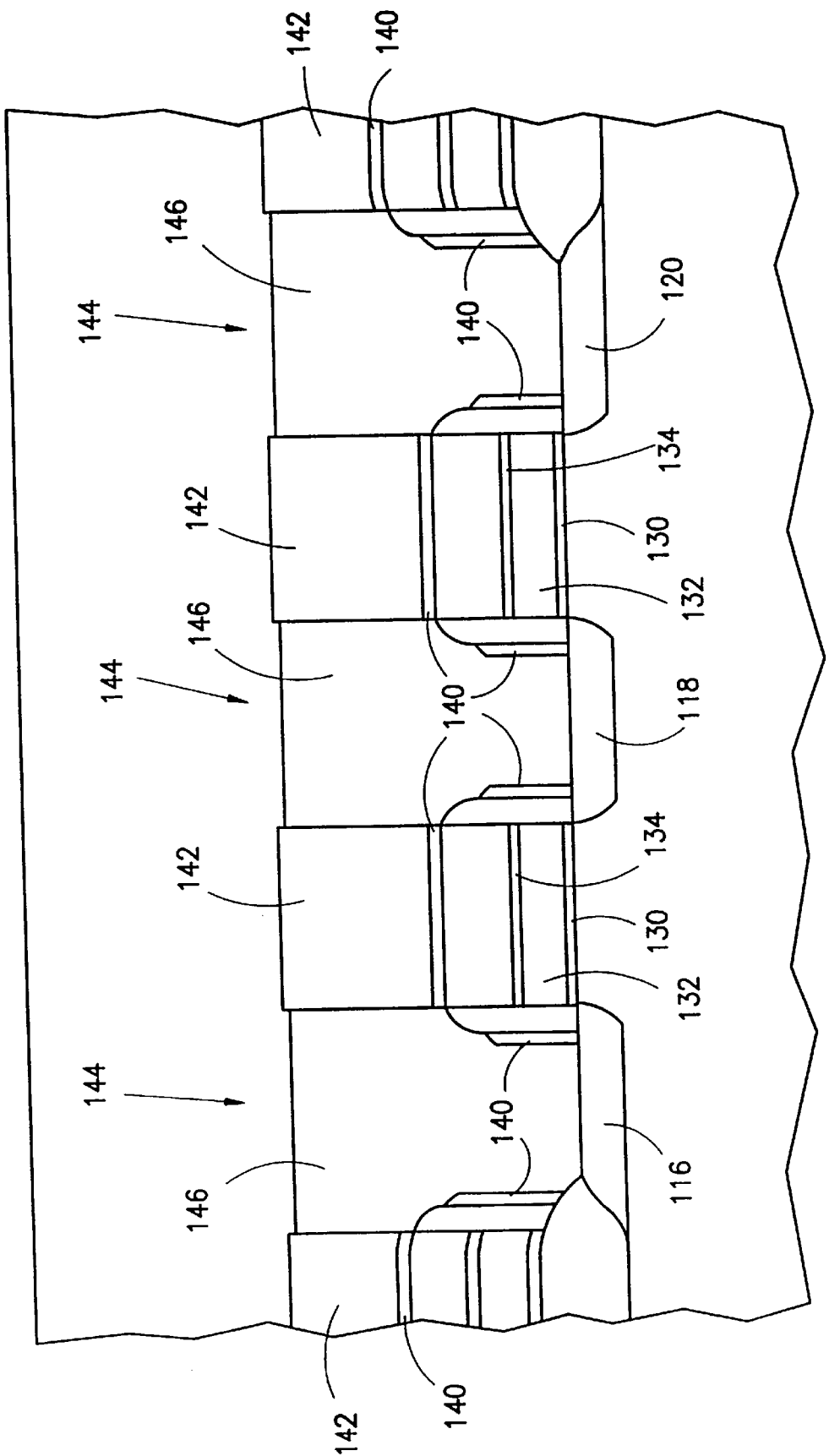
FIG. 8 is a diagrammatic cross-sectional view of a portion of a semiconductor wafer at a processing step subsequent to that shown in FIG. 7.

Referring now to FIG. 6, plug openings have been formed through the insulating layer 142. The plug openings 144 are formed through the insulating layer 142 by photomasking and dry chemical etching the BPSG relative to the thin nitride layer 140. Referring now to FIG. 7, a layer 146 of conductive material is deposited to provide conductive material within the plug openings 144. The conductive plug layer 146 is in contact with the active areas 116, 118, 120. An example of the material used to form conductive plug layer 146 is in situ arsenic or phosphorous doped poly. Referring now to FIG. 8, the conductive plug layer 146 is dry etched (or chemical-mechanical polished) to a point just below the upper surface of the BPSG layer 142 such that the remaining material of the conductive plug layer 146 forms electrically isolated plugs 146 over the active areas 116, 118, 120. In another embodiment, conventional electrode materials may be used and then provided with a barrier layer atop the electrode, or between the electrode and the dielectric, or in both locations. This embodiment is described further below with reference to FIG. 19.

Figure 9:
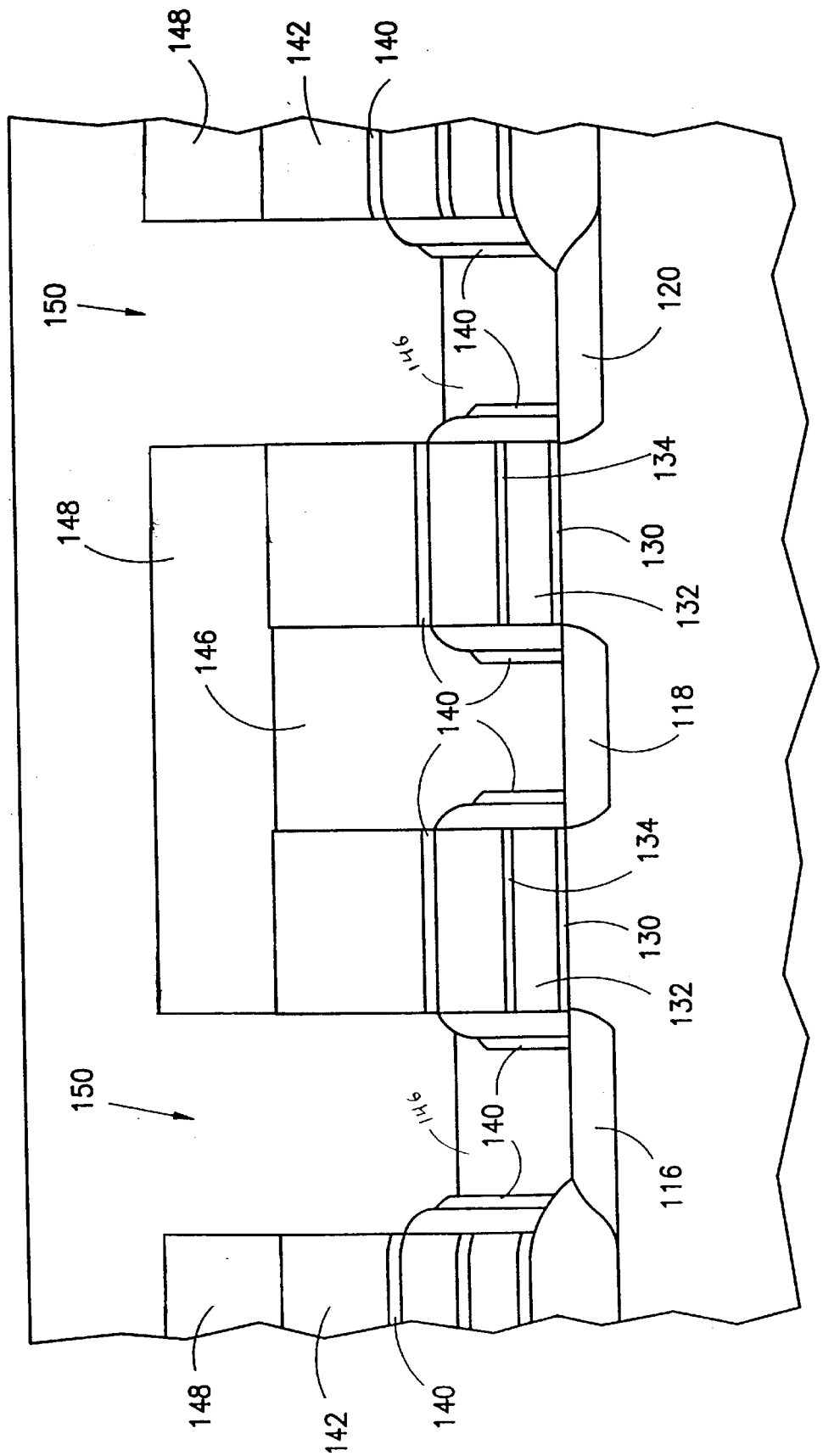
FIG. 9 is a diagrammatic cross-sectional view of a portion of a semiconductor wafer at a processing step subsequent to that shown in FIG. 8.

Still with reference to FIG. 8, an additional layer 148 of BPSG is then deposited on the structure. Referring now to FIG. 9, capacitor openings 150 are then formed in the BPSG layer 148 by photomasking and dry chemical etching. The height of the plugs, as defined by the conductive plug layer 146 over the non-bit line active areas 116, 120 is also reduced by this step.

Figure 10:
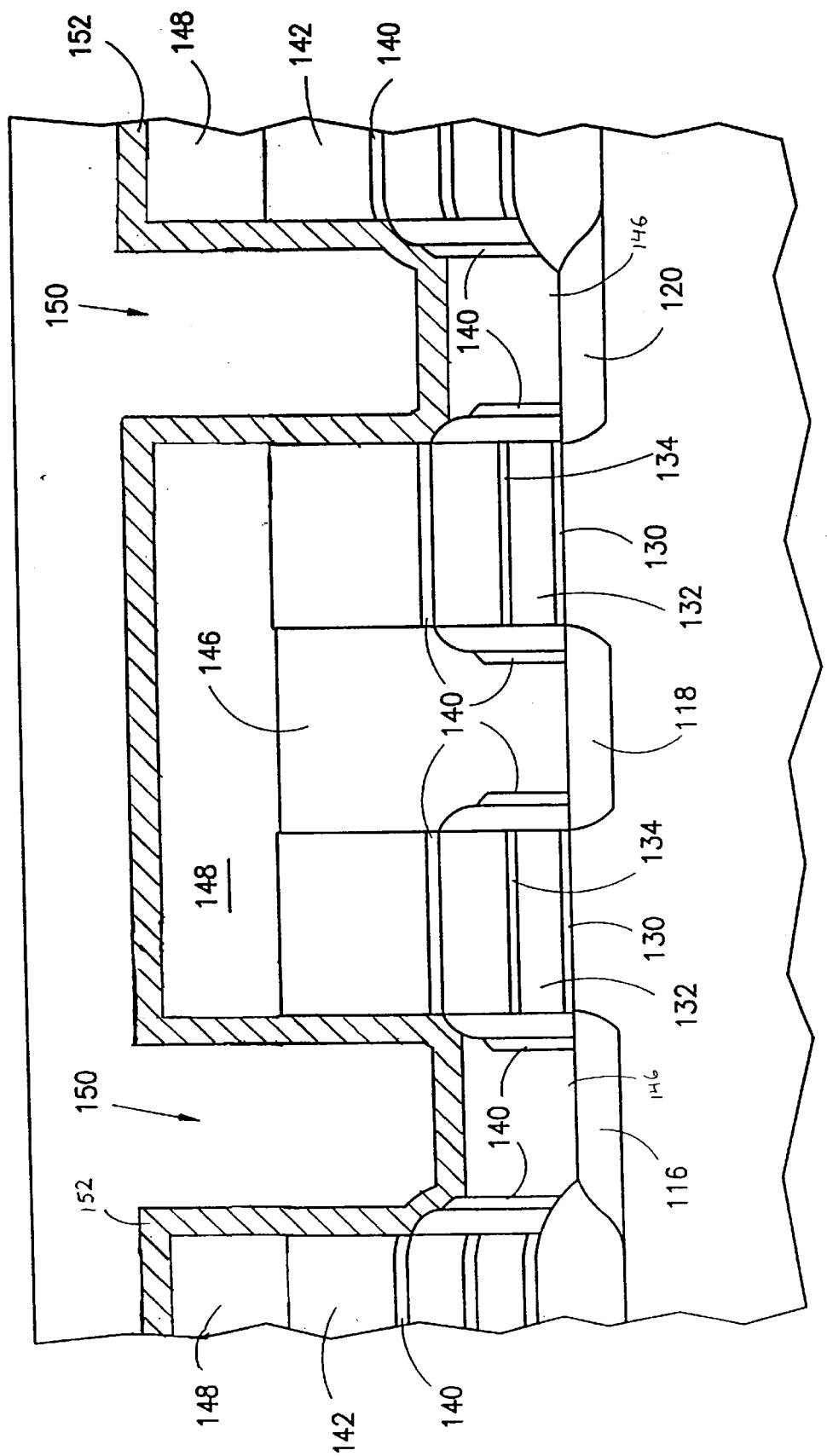
FIG. 10 is a diagrammatic cross-sectional view of a portion of a semiconductor wafer at a processing step subsequent to that shown in FIG. 9.

Referring now to FIG. 10, a conductive layer 152 of conductive material that will eventually form the double sided electrode of the capacitor is deposited at a thickness such that the capacitor openings 150 are not closed off. The term double sided electrode, as used herein, shall be understood to mean an electrode having at least two sides that emit, collect or deflect electric charge carriers, and which, at each of its two sides, opposes a corresponding electrode with a dielectric material disposed between each side of the double sided electrode and a corresponding electrode. The term dielectric is used herein shall be understood to mean any solid, liquid or gaseous material that can sustain an electrical field for use in the capacitor of a DRAM cell or other integrated circuit device containing a capacitor.

The conductive layer 152 may be formed of a Ruthenium (Ru) layer to increase capacitance. The only requirement for the selection of the conductive layer 152 is that the metal or alloy form an oxide that is also conductive. Non-limiting examples of materials that may be used to form the conductive layer 152 are $RuO_2$, Ir, $IrO_2$, Ta, Rh, $RhO_x$, $VO_3$, and alloys, such as Pt—Ru or Pt—Rh. The conductive layer 152 may be deposited onto the insulating layer 142 by CVD, LPCVD, PECVD, MOCVD, sputtering or other suitable deposition techniques.

If Ru is used as the conductive layer 152, the conductive layer 152 may be formed by first depositing a layer of Ru over the insulating layer 142 by chemical vapor deposition (CVD) or any other conformal process. Preferably the conductive layer 152 has a thickness of about 100 to about 1000 Angstroms, more preferably less than 500 Angstroms.

Figure 11:
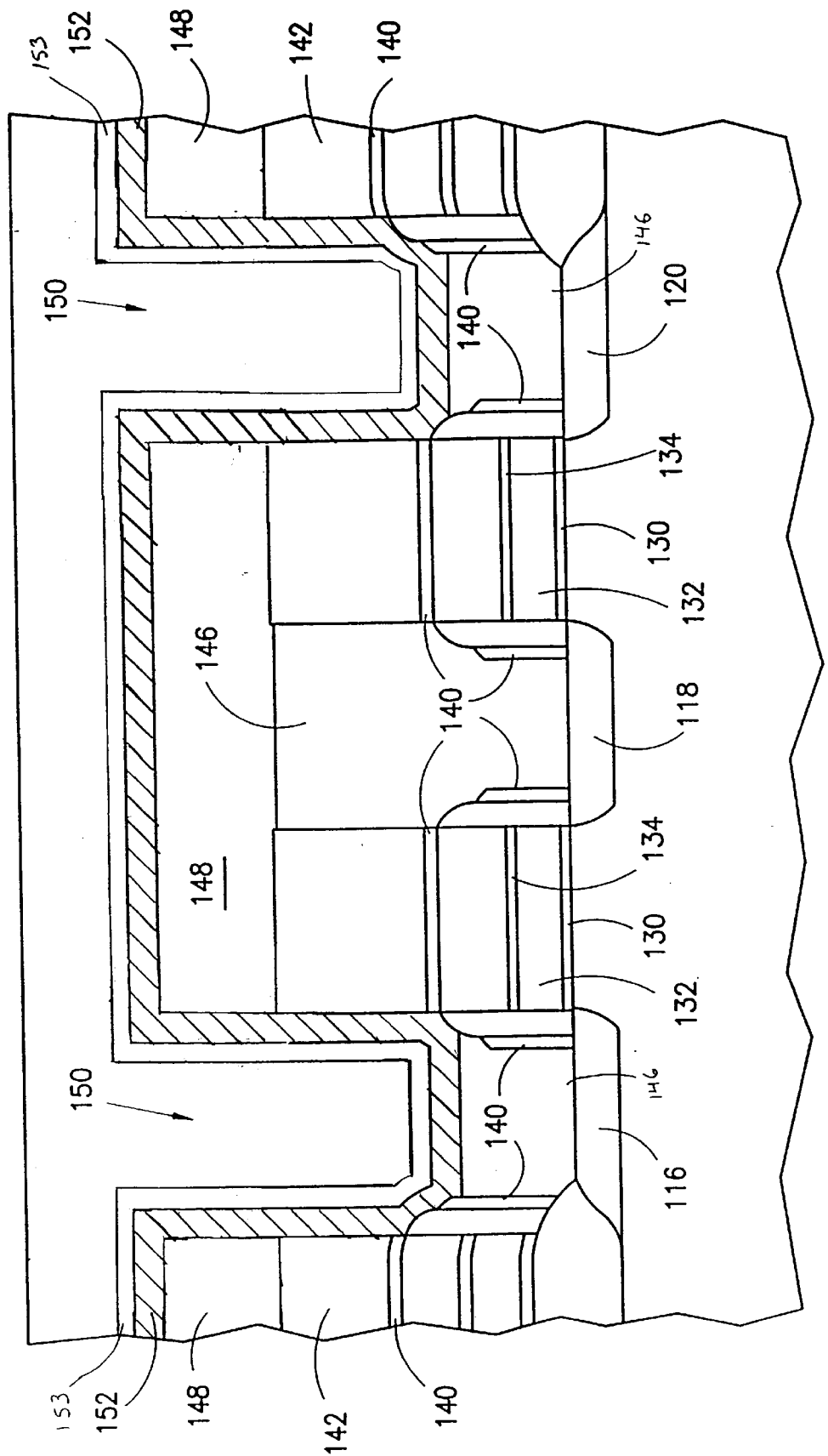
FIG. 11 is a diagrammatic cross-sectional view of a portion of a semiconductor wafer at a processing step subsequent to that shown in FIG. 10.

Referring to FIG. 11, a capacitance layer 153 is deposited over the conductive layer 152. The capacitance layer 153 may also be formed of HSG (hemispherical grained poly), silica, silicon, germanium or an alloy of silica or germanium to increase capacitance. Preferably the capacitance layer 153 is formed of HSG (hemispherical grained poly). If HSG is used, the capacitance layer 153 may be formed by first depositing a layer of in situ doped polysilicon followed by a deposition of undoped HSG. Subsequent heating inherent in wafer processing will effectively conductively dope the overlying HSG layer. Alternatively, the capacitance layer 153 may be provided by in situ arsenic doping of an entire HSG layer or the capacitance layer 153 may be formed by depositing amorphous silicon at this step and then using a selective seed followed by an annealing process and chemical mechanical polishing. The conductive layer 152 and the capacitance layer 153 are in electrical contact with the previously formed plugs 146 over the non-bit line active areas 116, 120.

Figure 12:
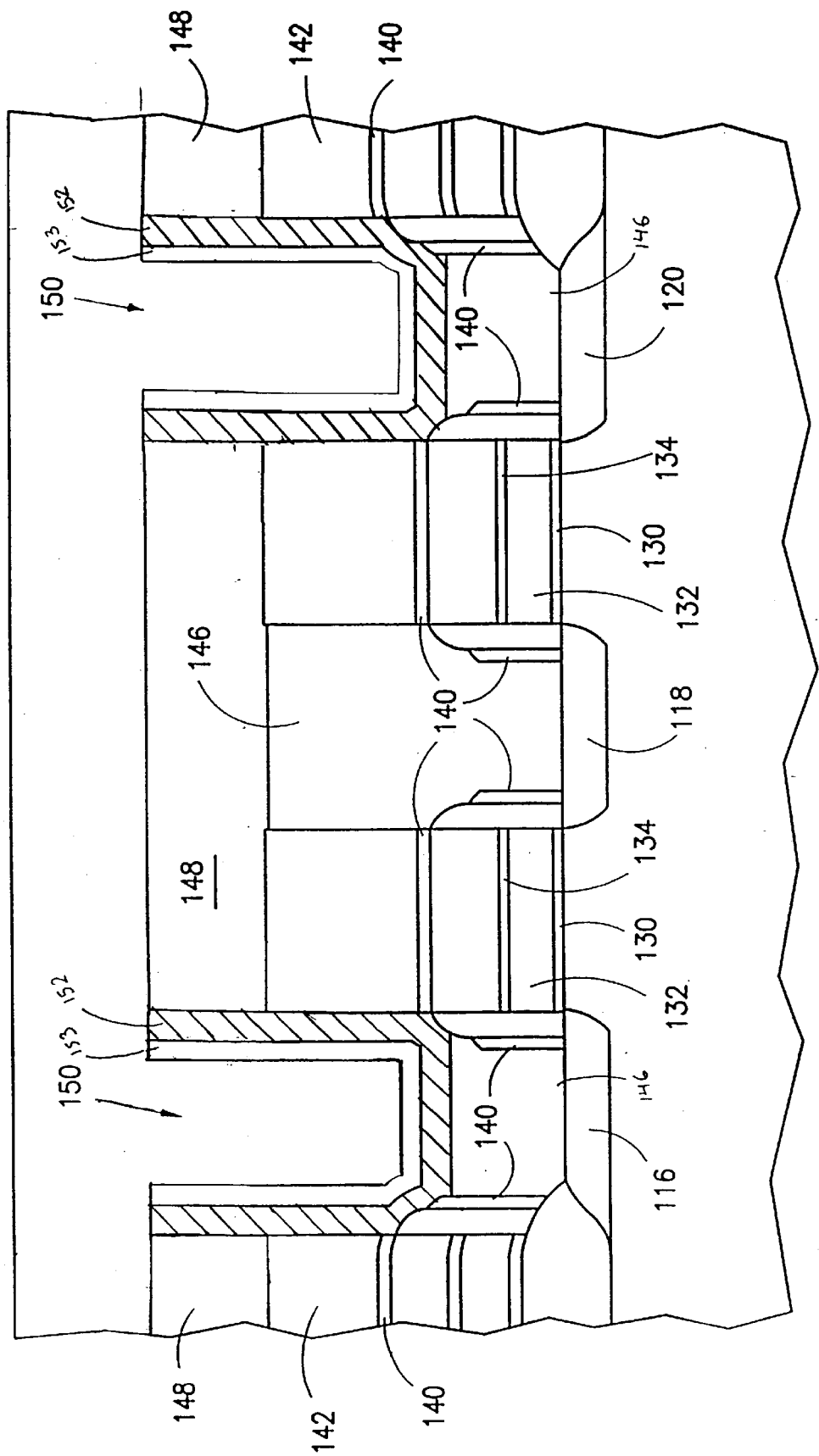
FIG. 12 is a diagrammatic cross-sectional view of a portion of a semiconductor wafer at a processing step subsequent to that shown in FIG. 11.

Referring now to FIG. 12, the portions of the conductive layer 152 and the capacitance layer 153 above the top of the second BPSG layer 148 are removed through a CMP or etching process, thereby electrically isolating the portions of conductive layer 152 and the capacitance layer 153 remaining in the capacitor openings 150.

Figure 13:
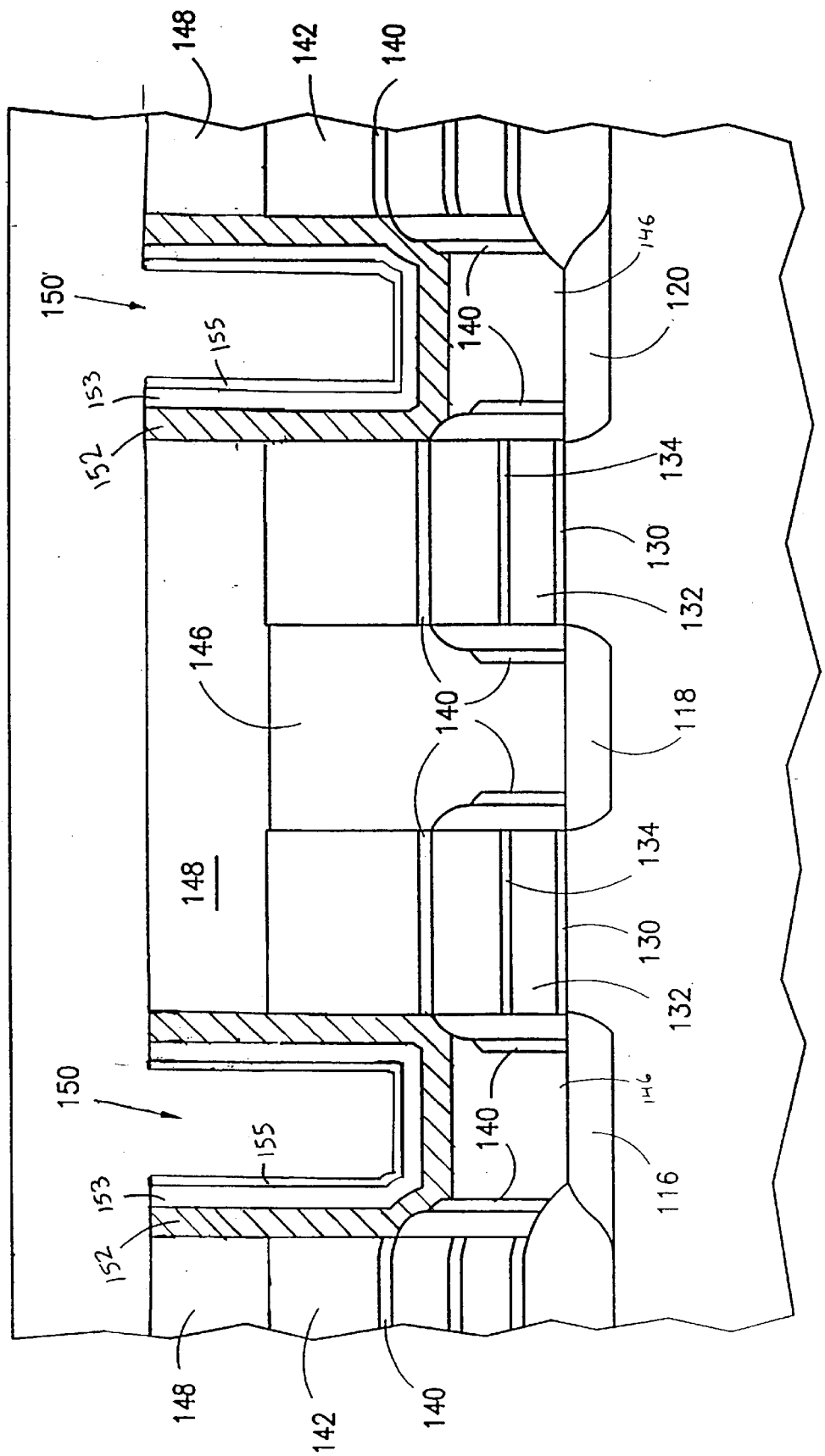
FIG. 13 is a diagrammatic cross-sectional view of a portion of a semiconductor wafer at a processing step subsequent to that shown in FIG. 12.

Referring now to FIG. 13, a dielectric film layer 155 is formed over the surface of capacitance layer 153. The preferred dielectric film is a nitride film and though this nitride film may be formed using various methods, it is preferred to use rapid thermal nitridation (RTN) processing at a temperature ranging from about 600° C. to about 1200° C., preferably between 800° C. and 1000° C. for a time period ranging from about 5 seconds to about 60 seconds, preferably from about 20 seconds to about 60 seconds. The nitride film of the dielectric film layer 155 is formed using RTN in the presence of $NH_3$, hydrazine, an ammonia plasma, or other nitrogen sources in order to form a nitride layer on the capacitance layer 153. The dielectric film layer 155 preferably has a thickness of from about 10 to about 50 Angstroms, more preferably from about 15 to about 30 Angstroms.

Figure 14:
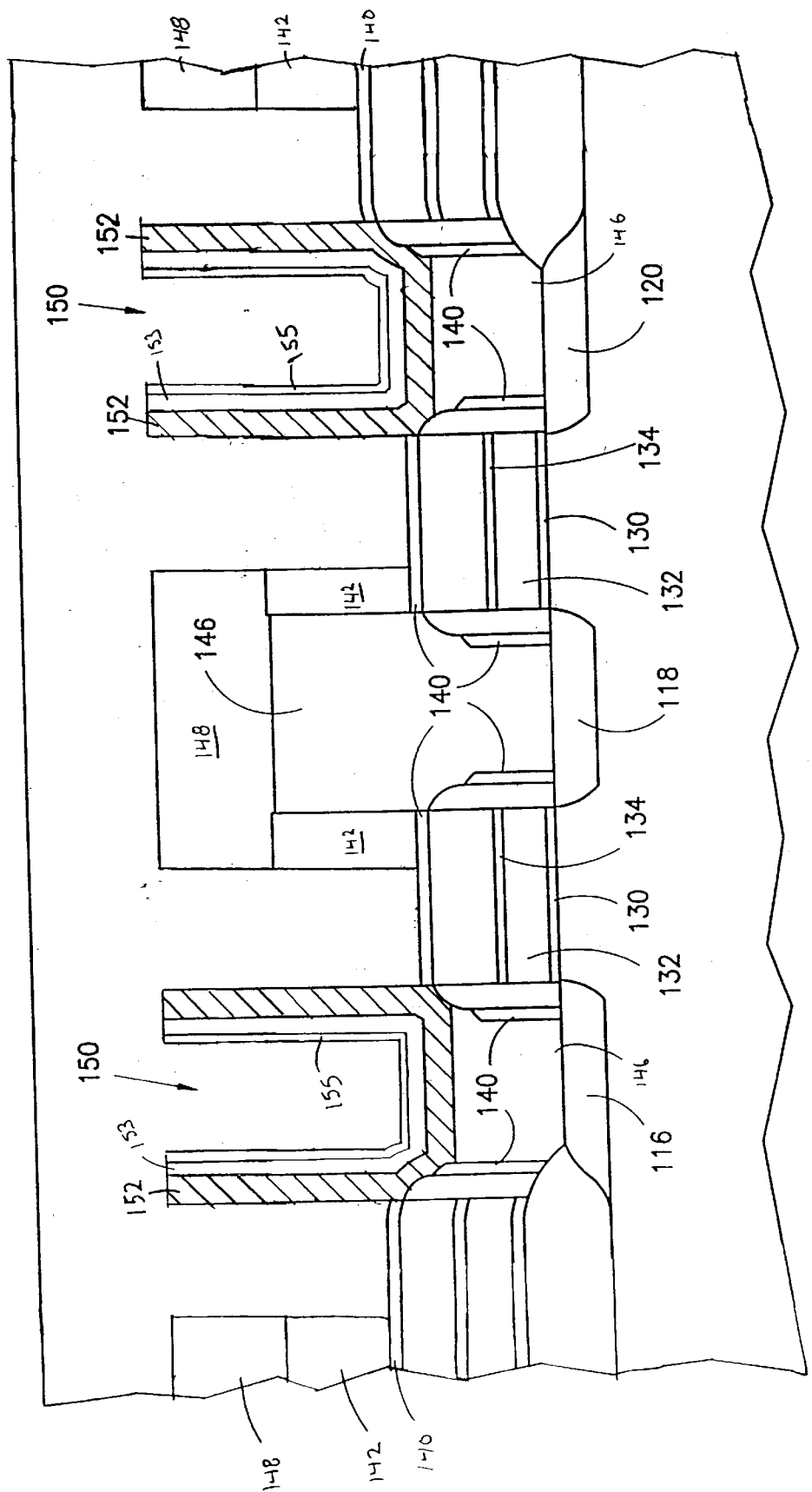
FIG. 14 is a diagrammatic cross-sectional view of a portion of a semiconductor wafer at a processing step subsequent to that shown in FIG. 13.

Referring now to FIG. 14, the insulating layer 142, which is preferably formed of BPSG, and the BPSG layer 148, are then etched back around the conductive layer 152, in order to expose the conductive layer 152. The insulating layer 142 and the BPSG layer 148 are preferably removed by the use of an etchant containing a dilute solution of hydrofluoric acid (HF), such as a 10:1 volumetric ratio of water to 49% HF solution; however, the invention is not limited to this particular etchant. Any method of exposing conductive layer 152 or of removing the insulating layer 142 and the BPSG layer 148 from around the conductive layer 152 is within the scope of the present invention.

Figure 15:
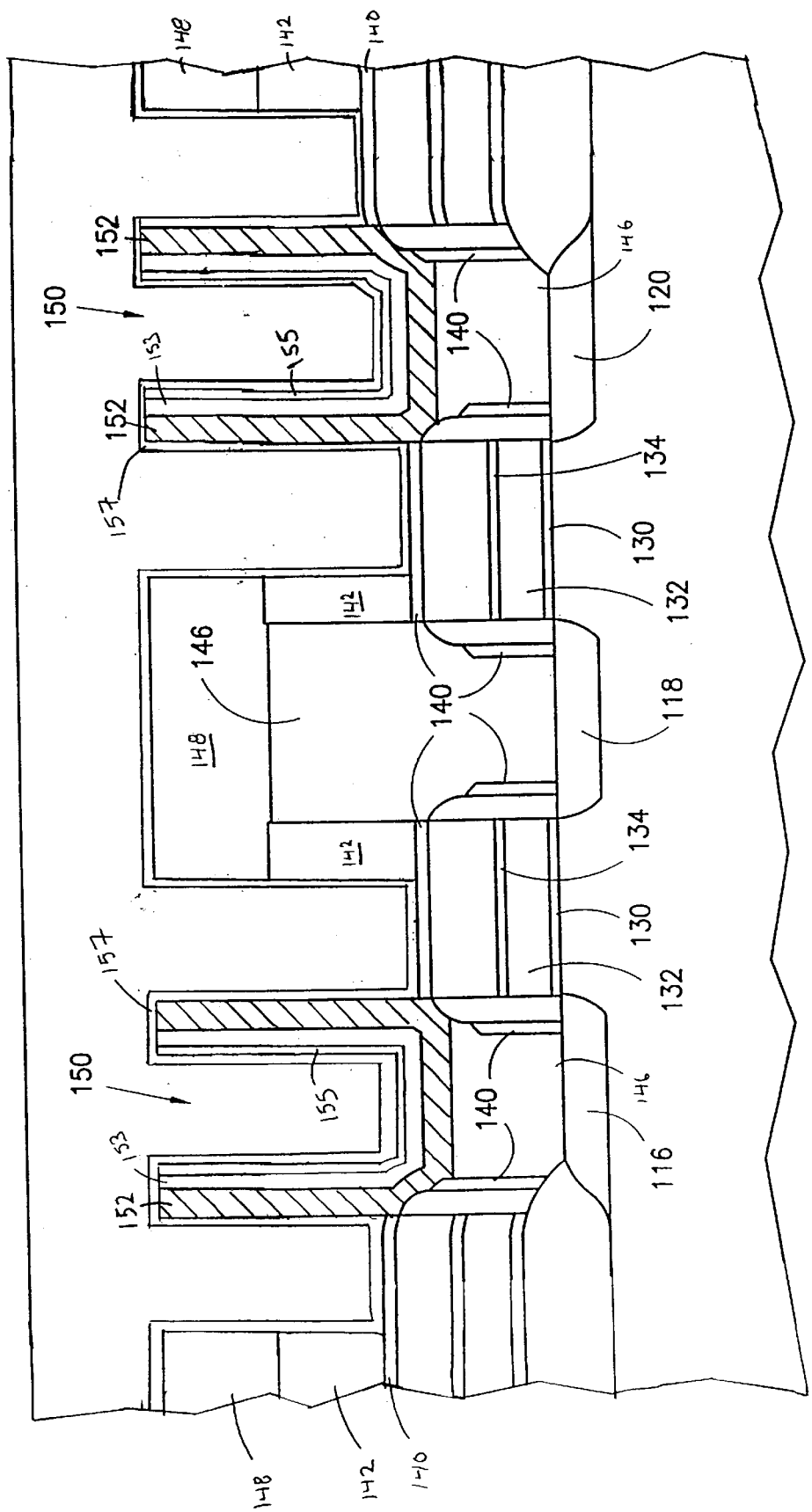
FIG. 15 is a diagrammatic cross-sectional view of a portion of a semiconductor wafer at a processing step subsequent to that shown in FIG. 14.

Referring now to FIG. 15, dielectric layer 157 is deposited over the remaining insulating layer 142, the exposed portion of the conductive layer 152, the BPSG layer 148, and the dielectric film layer 155. The dielectric layer 157 is preferably deposited such that the capacitor openings 150 are not filled. The dielectric layer 157 may be formed from dielectric materials such as: $Ta_2O_5$, $SrTiO_3$, $Y_2O_3$, $Nb_2O_5$, $ZrO_2$, titanium oxide or the like. Preferably, the dielectric layer 157 is $Ta_2O_5$. The dielectric layer 157 may be deposited by a low-pressure CVD process using $Ta(OC_2H_5)_5$ and $O_2$ at about 430° C., and may be subsequently annealed in order to reduce leakage current characteristics.

Figure 1:
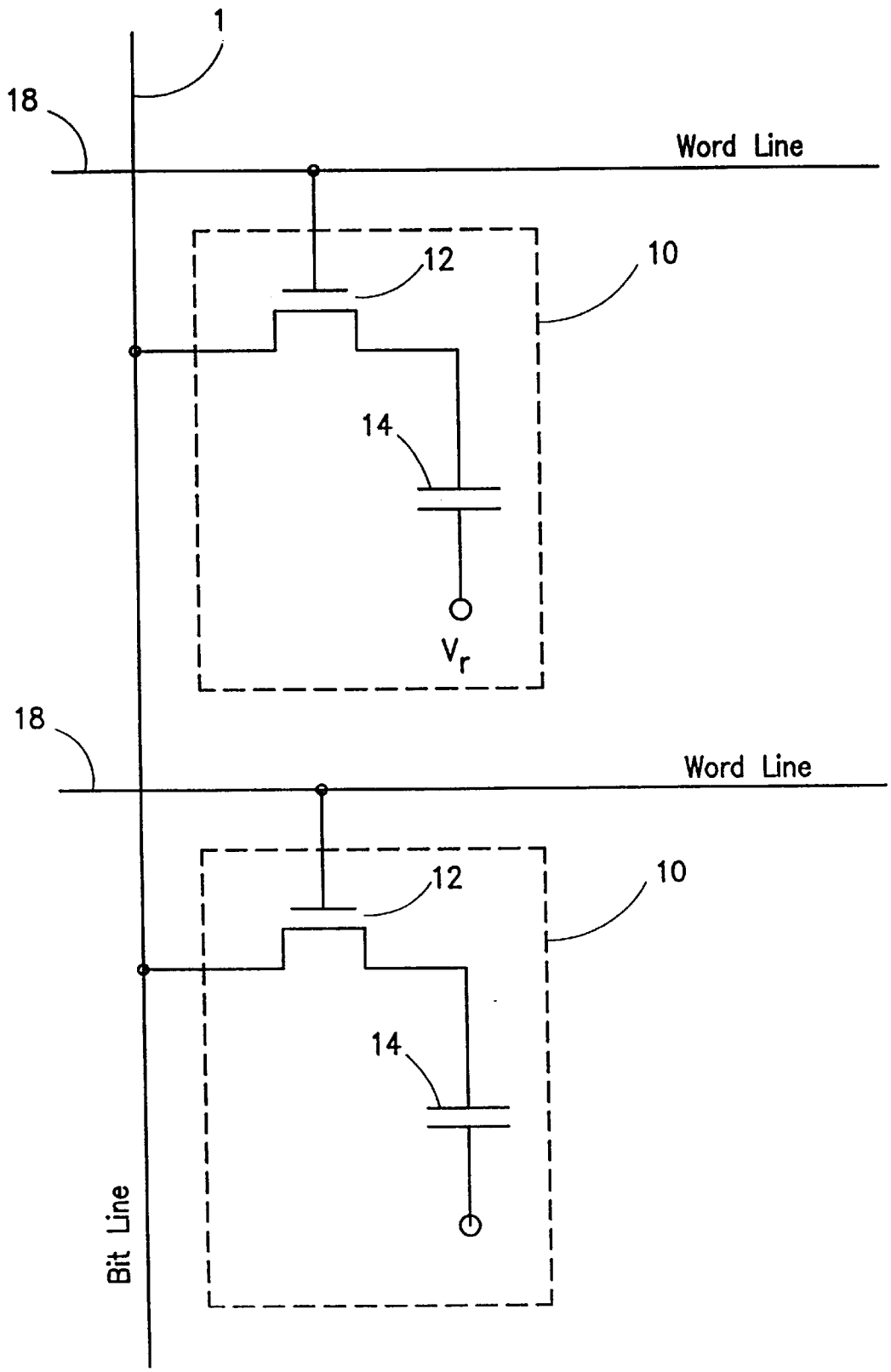
FIG. 1 is a circuit diagram of a portion of a conventional DRAM memory circuit.
Figure 2:
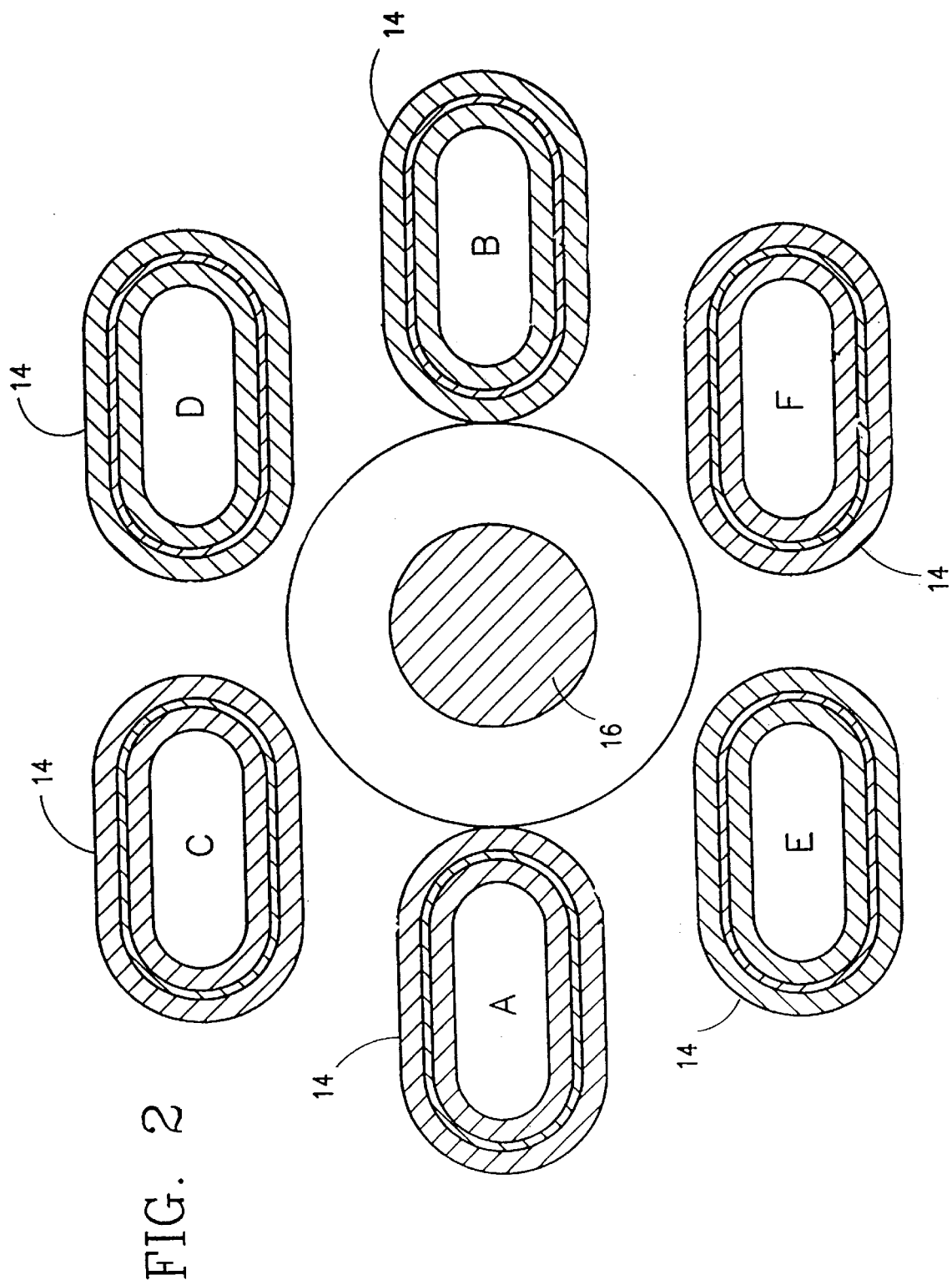
FIG. 2 is a top view of a cross section of a known memory circuit showing a number of conventionally shaped container capacitors surrounding a bit line contact.
Figure 16:
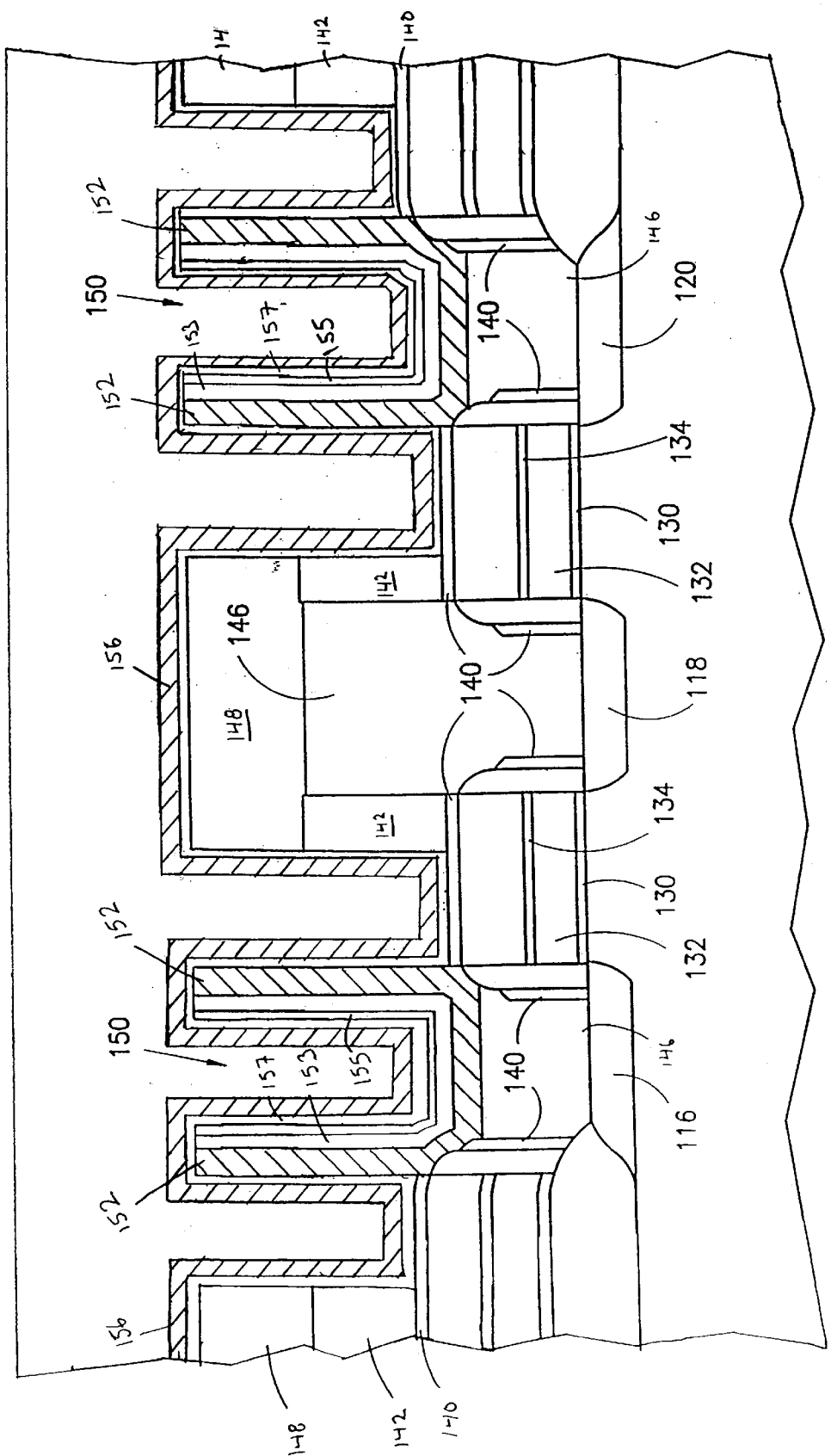
FIG. 16 is a diagrammatic cross-sectional view of a portion of a semiconductor wafer at a processing step subsequent to that shown in FIG. 15.

Referring now to FIG. 16, a second conductive layer 156 is deposited to form the corresponding electrode over the dielectric layer 157, again at a thickness which less than completely fills the bit line contact and capacitor openings 150, 146. The second conductive layer 156 is preferably composed of titanium nitride. A poly silicon layer (not shown) may be coated over the second conductive layer 156. It should be understood that the second conductive layer 156 may be formed of any conductive material. In addition to serving as the second plate or corresponding electrode of the capacitor, the second conductive layer 156 also forms the interconnection lines between the second plates of the capacitors. The second plate of the capacitor is connected to the reference voltage, as discussed above in connection with FIG. 1.

Figure 17:
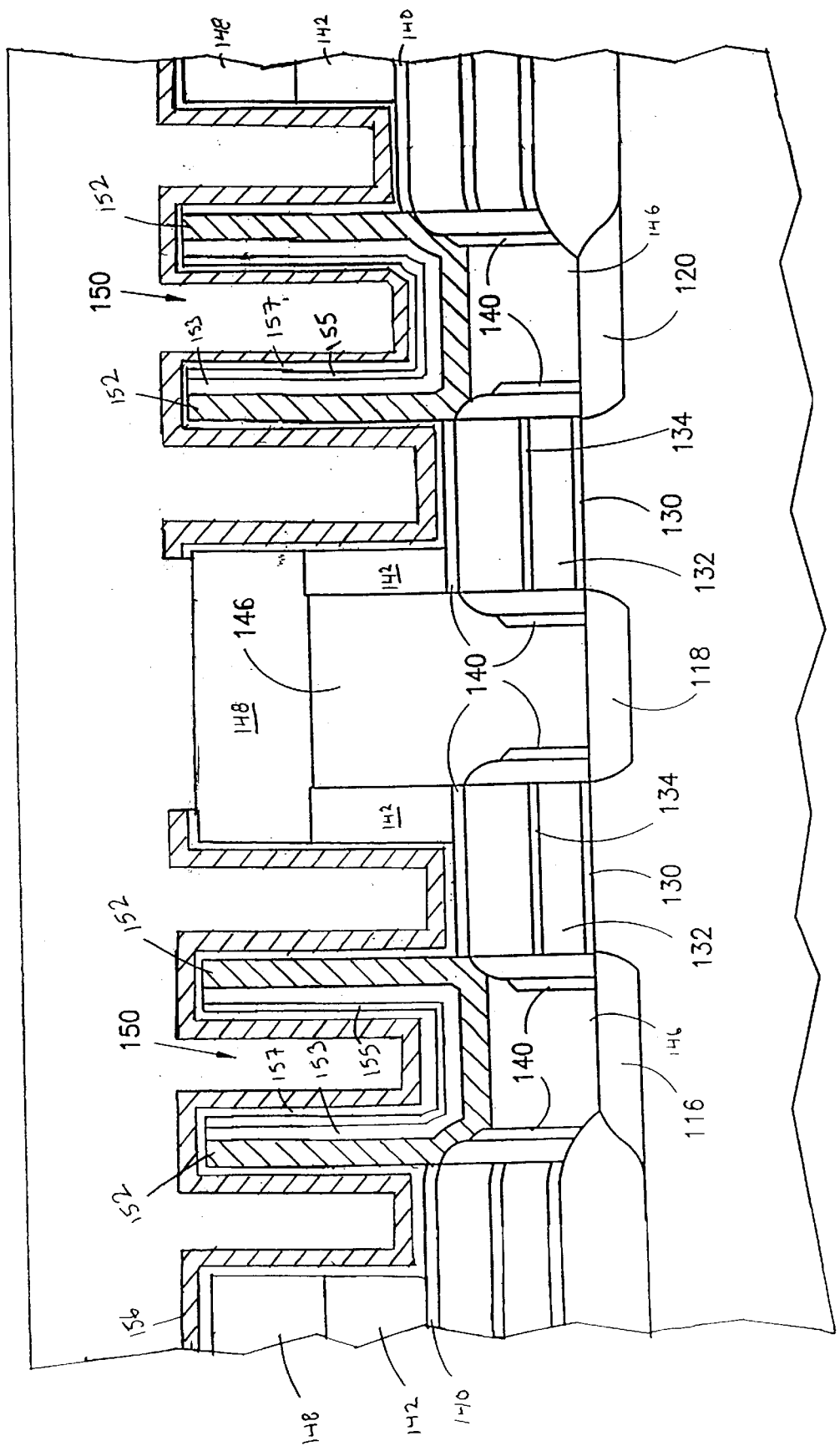
FIG. 17 is a diagrammatic cross-sectional view of a portion of a semiconductor wafer at a processing step subsequent to that shown in FIG. 16.

Referring now to FIG. 17, the second conductive layer 156 and underlying capacitor dielectric layers are patterned and etched such that the remaining portions of the dielectric layer 157 and second conductive layer 156 over each capacitor opening 150 are electrically isolated from one another. In this manner, each of the active areas 116, 118, 120 are also electrically isolated (without the influence of the gate).

Figure 18:
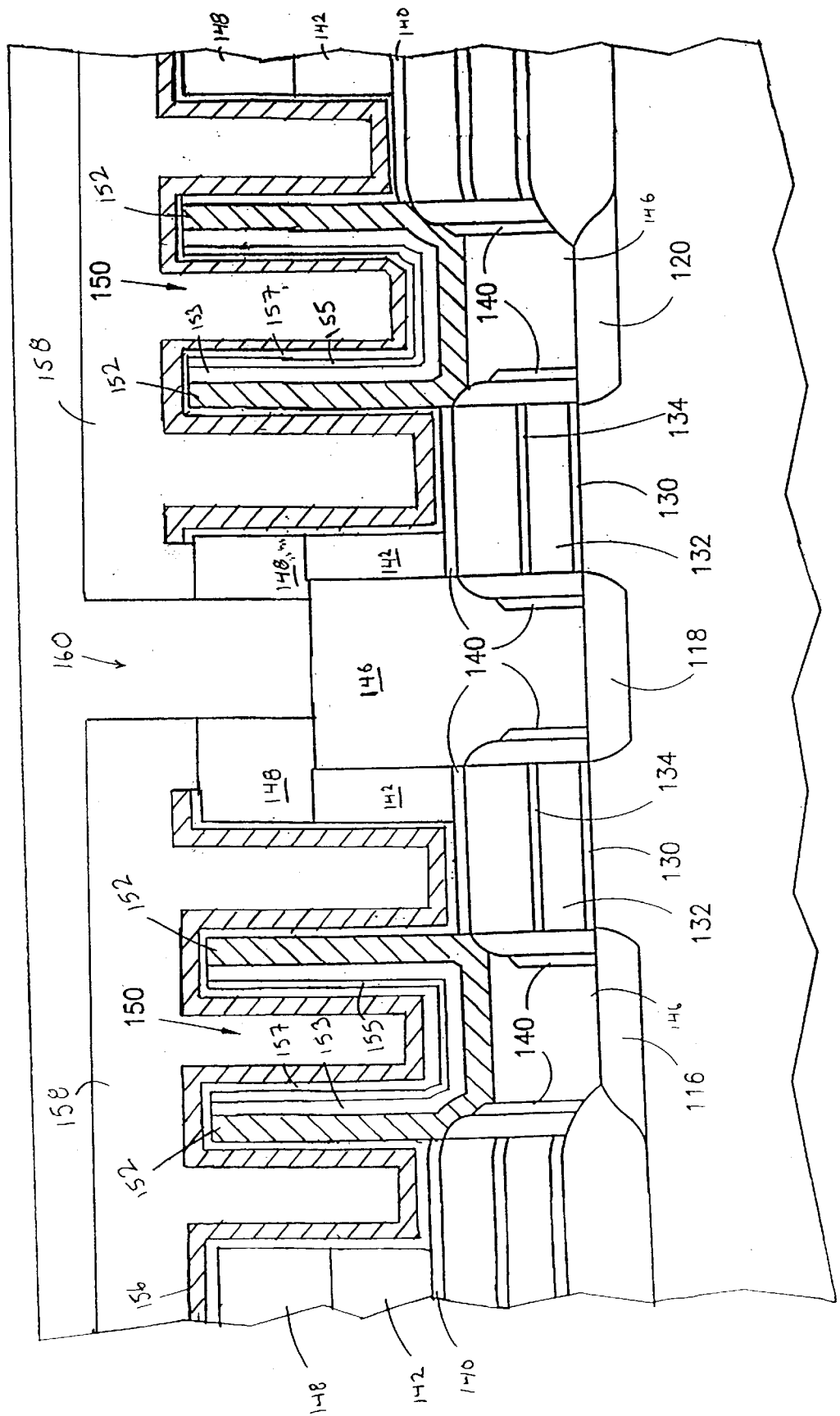
FIG. 18 is a diagrammatic cross-sectional view of a portion of a semiconductor wafer at a processing step subsequent to that shown in FIG. 17.

Referring now to FIG. 18, a bit line insulating layer 158 is provided over the second conductive layer 156 and the second BPSG layer 148. The bit line insulating layer 158 may be comprised of BPSG, PSG, flowable glass, spun glass or other insulative material. Preferably the bit line insulating layer 158 is BPSG. A bit line contact opening 160 is patterned through the bit line insulating layer 158 such that the conductive plug layer 146 is once again outwardly exposed. Then a bit line contact is provided in the bit line contact opening 160 such that the bit line contact is in electrical contact with the outwardly exposed portion of the plug 146. Thus, the outwardly exposed portion of the plug 146 over the active area 118 common to both FETs acts as a bit line contact.

Figure 19:
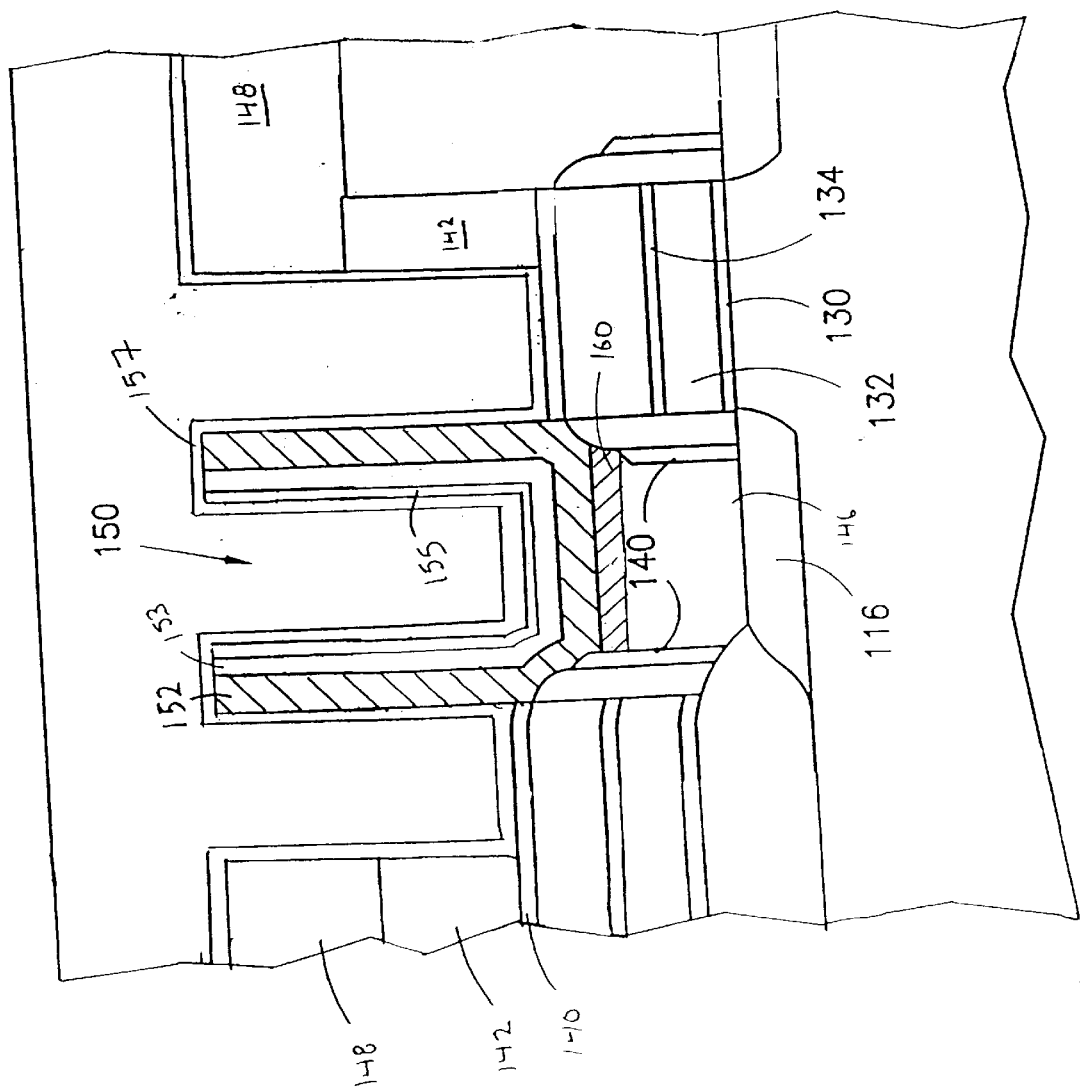
FIG. 19 is a cross section of another embodiment of the invention having a barrier layer between the plug and the lower electrode of the capacitor.

FIG. 19 illustrates another embodiment of the double sided electrode capacitor of the invention. As can be seen from this figure, a barrier layer 160 is formed between the conductive layer 152, which forms the double sided electrode of the capacitor, and the conductive plug layer 146. The barrier layer 160 according to the invention may be comprised of materials that have excellent conductivity and the ability to reduce depletion effects and enhance frequency response. The barrier layer materials also possess excellent barrier properties for protection of cell dielectrics during BPSG reflow and other high temperature steps after capacitor formation, and also prevent the diffusion of silicon and oxygen into the cell. Suitable barrier layer materials are, for example, titanium nitride, aluminum nitride, titanium boride, zirconium boride and hafnium boride. The barrier layer 160 may be as thin as 50 to 300 Angstroms and still improve conduction, reduce migration of silicon into the cell, and reduce oxidation of the cell.

Figure 20:
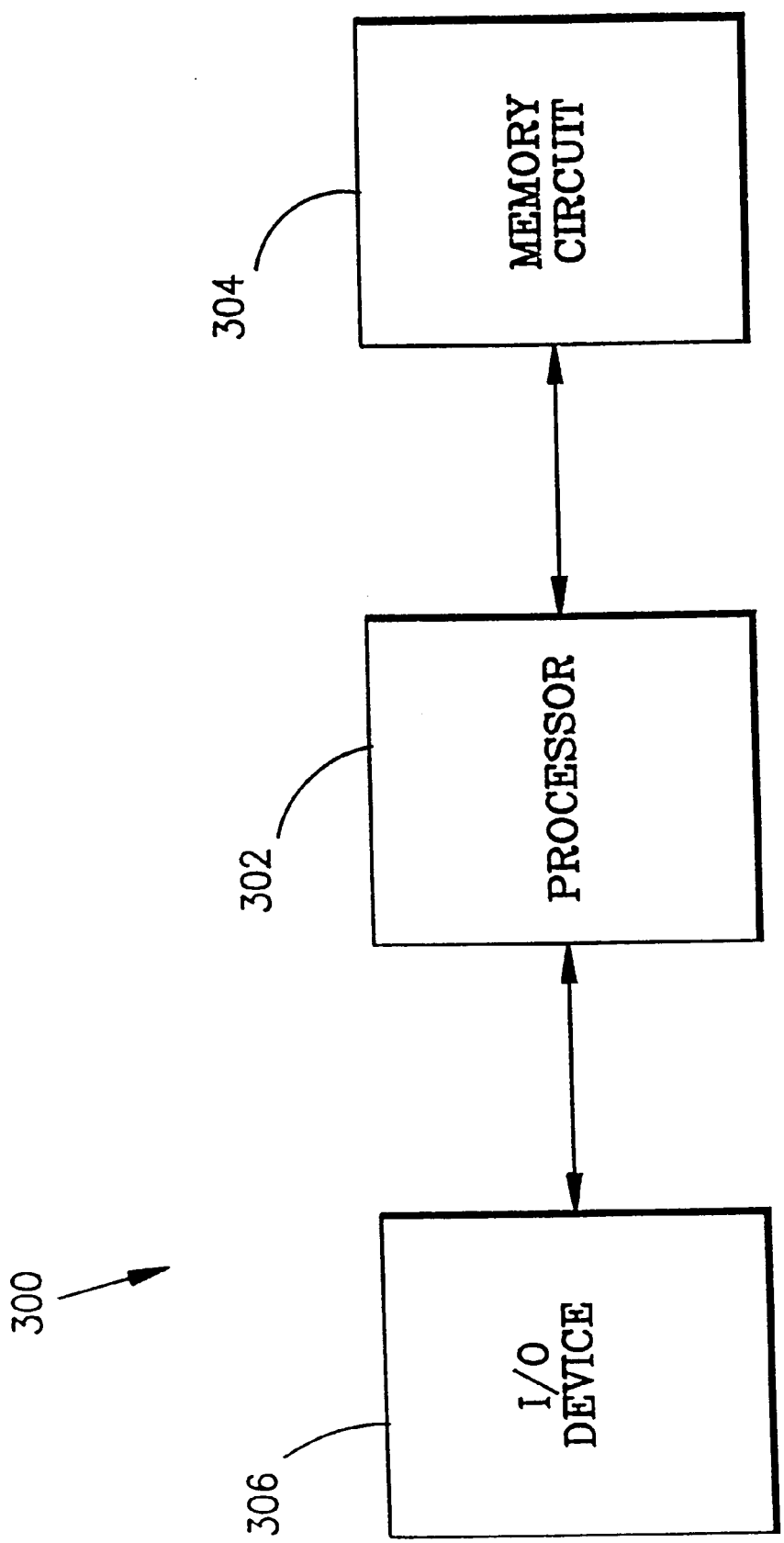
FIG. 20 is a block diagram of a computer system comprising a memory including a double sided capacitor.

FIG. 20 illustrates a computer system 300 according to one embodiment of the present invention. The computer system 300 comprises a CPU (central processing unit) 302, a memory circuit 304, and an I/O (input/output) device 306. The memory circuit 304 contains a DRAM memory circuit including the capacitors according to the present invention. Memory other than DRAM may be used. Also, the CPU itself may be an integrated processor which utilizes integrated capacitors according to the present invention.

Figure 3B:
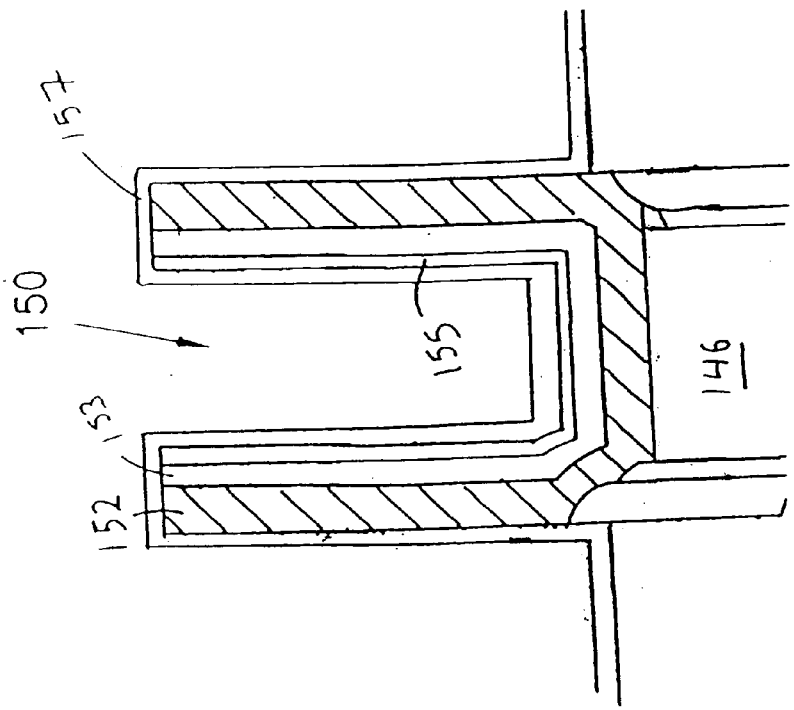
FIG. 3B is a side view of the cross section of FIG. 3A.
Figure 3A:
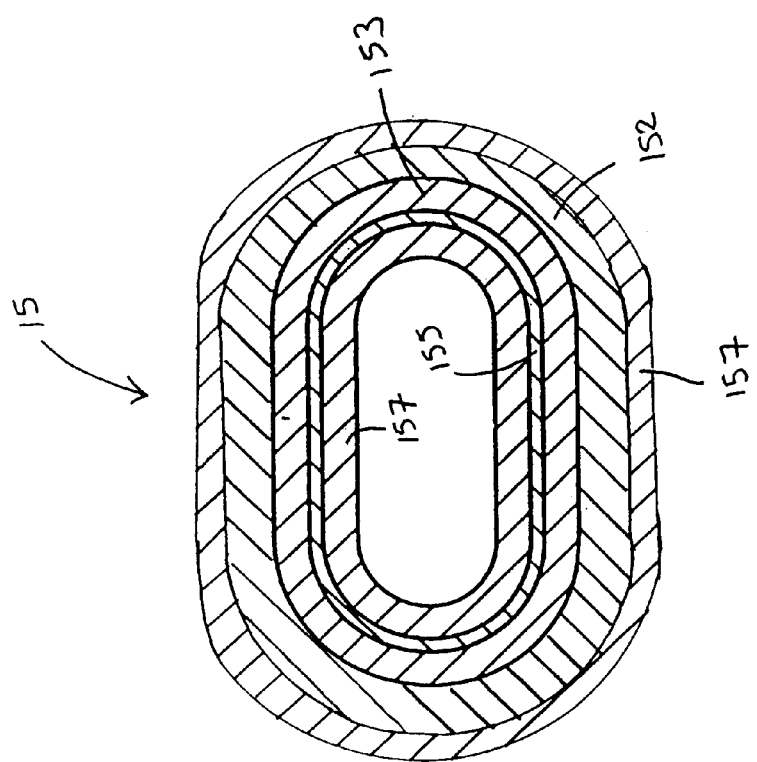
FIG. 3A is top view of a partially cut away cross section of one embodiment of a memory circuit according to the present invention showing a double sided lower electrode capacitor according to the invention.

The advantages of the capacitors in accordance with the present invention will now be discussed in further detail with reference to FIGS. 3A and 3B. As noted, FIG. 3A shows a top view of a capacitor from which the upper layers have been removed to reveal the container capacitor 15. The capacitor 15 has a double sided lower electrode 152 which is in electrical contact with the plug 146 as shown in FIG. 3B. The lower electrode is formed of a conductive layer 152. As noted in the figures, on one side of the lower electrode 152 of the capacitor 15, there is a capacitance layer 153, preferably formed of HSG. Atop the capacitance layer 153 is a dielectric film layer 155. Preferably, the dielectric film layer 155 is formed of a nitride film through an RTN process. Atop the dielectric film layer 155, and also on the other side of the lower electrode 152, are dielectric layers 157. Preferably the dielectric layer 157 is comprised of $Ta_2O_5$. It should be noted, as set forth in the drawings, that there is no dielectric film layer 155 on the non-capacitance layer (HSG) side of the lower electrode 152.

The result of such a structure is that the effective dielectric constant of the dielectric layer 157 on the outside of the capacitor 15 will be high, for example, about 20 to 25 for $Ta_2O_5$ as the dielectric. This is due to the double sided lower electrode and the lack of RTN in series with the dielectric layer 157 on the outside of the capacitor. The effective dielectric constant of the dielectric layer 157 over the dielectric film layer 155 and the capacitance layer 153 is between about 10 and about 12. Thus, the capacitance per area (C/A) will be more than 17 $fF/\mu m^2$ for the outside of the capacitor 15, and more than 24 $fF/\mu m^2$ for the inside of the capacitor 15, due to the surface area of the inside of the capacitor and the fabrication of the capacitor as described above.

Thus, for example, for a 0.18 DRAM cell, the surface area of the outside of the capacitor is about 1 $\mu m^2$ for 1 $\mu m$ tall containers fully etched back. By using the preferred capacitor of the present invention, the capacitor would have an increase of more than 7 $fF/\mu m^2$ per cell over previous HSG inside/smooth polysilicon outside capacitors. This results in approximately a 1.8 times capacitance enhancement factor for the outside of the capacitor compared to previous structures. The present invention provides an increased effective capacitance and a high capacitance per cell. The present invention also provides a capacitor that has high storage capacitance without increasing the size of the capacitor. The present invention also enables an increased efficiency for the cell without a corresponding increase in the size of the cell.

It should again be noted that although the invention has been described with specific reference to DRAM memory circuits and container capacitors, the invention has broader applicability and may be used in any integrated circuit requiring capacitors. Similarly, the process described above is but one method of many that could be used. Accordingly, the above description and accompanying drawings are only illustrative of preferred embodiments which can achieve and provide the objects, features and advantages of the present invention. It is not intended that the invention be limited to the embodiments shown and described in detail herein. The invention is only limited by the spirit and scope of the following claims.

What is claimed as new and desired to be protected by Letters Patent of the United States is:

1. A capacitor comprising:
   a double sided electrode;
   a first conductive layer in contact with an inner side of said double sided electrode;
   a first dielectric layer in contact with said first conductive layer, said fist dielectric layer located within the inner side of said double sided electrode;
   a second dielectric layer in contact with an outer side of said double sided electrode and said first dielectric layer; and
   a second conductive layer, wherein said dielectric layers are between said first conductive layer and said second conductive layer.

2. The capacitor of claim 1, wherein said double sided electrode is a lower electrode.

3. The capacitor of claim 1, wherein said double sided electrode is formed of a metal, wherein an oxide of said metal is conductive.

4. The capacitor of claim 1, wherein said double sided electrode is formed of a material selected from the group consisting of Ru, $RuO_2$, Ir, $IrO_2$, Ta, Rh, $RhO_x$ $VO_3$, a Pt—Ru alloy and a Pt—Rh alloy.

5. The capacitor of claim 4, wherein said material is Ruthenium.

6. The capacitor of claim 1, further comprising a barrier layer in contact with a portion of said double sided electrode.

7. The capacitor of claim 1, wherein said first conductive layer is selected from the group consisting of hemispherical grained polysilicon, silica, silicon, germanium, and alloys of silica or germanium.

8. The capacitor of claim 1, wherein said first dielectric layer is a nitride film.

9. The capacitor according to claim 1, wherein said second dielectric layer is selected from the group consisting of $Ta_2O_5$, $SrTiO_3$, $Y_2O_3$, $Nb_2O_5$, $ZrO_2$, and titanium oxide.

10. The capacitor according to claim 1, wherein said capacitor is a stacked capacitor.

11. The capacitor according to claim 1, wherein said capacitor is a container capacitor.

12. The capacitor according to claim 1, wherein said capacitor is in a DRAM cell.

13. A computer system comprising:
    a processor; and
    a memory circuit connected to the processor, wherein one or more of said processor or memory circuits contain at least one capacitor, said capacitor comprising:

a double sided electrode formed of a metal, wherein an oxide of said metal is conductive;

a first conductive layer in contact with an inner side of said double sided electrode;

a first dielectric layer in contact with said first conductive layer, said first dielectric layer located within the inner side of said double sided electrode; and a second dielectric layer in contact with an outer side of said double sided electrode and said first dielectric layer.

14. The computer system of claim 13, wherein said double sided electrode is a lower electrode.

15. The computer system of claim 13, wherein said double sided lower electrode is formed of a material selected from the group consisting of Ru, $RuO_2$, Ir, $IrO_2$, Ta, Rh, $RhO_x$, $VO_3$, a Pt—Ru alloy and a Pt—Rh alloy.

16. The computer system of claim 13, wherein said memory circuit is a DRAM cell.

17. The computer system of claim 13, wherein said capacitor is a container capacitor.

18. A memory cell comprising:

a transistor; and a capacitor, said transistor and capacitor being connected in a memory array, said capacitor comprising:

a double sided electrode formed of a metal, wherein an oxide of said metal is conductive;

a first conductive layer in contact with an inner side of said double sided electrode;

a first dielectric layer in contact with said conductive layer, said first dielectric layer located within the inner side of said double sided electrode; and a second dielectric layer in contact with an outer side of said double sided electrode and said first dielectric layer.

19. The memory cell of claim 18, wherein said double sided electrode is a lower electrode.

20. The memory cell of claim 19, wherein said double sided lower electrode is formed of a material selected from the group consisting of Ru, $RuO_2$, Ir, $IrO_2$, Ta, Rh, $RhO_x$, $VO_3$, a Pt—Ru alloy and a Pt—Rh alloy.

21. The memory cell of claim 18, wherein said double sided electrode is a lower electrode.

22. The memory cell of claim 21, wherein said lower electrode is formed of a metal, wherein an oxide of said metal is conductive.

23. The memory cell of claim 22, further comprising a barrier in contact with a portion of said lower electrode.

24. The memory cell of claim 18, wherein said first conductive layer is selected from the group consisting of hemispherical grained polysilicon, silica, silicon, germanium, and alloys of silica or germanium.

25. The memory cell of claim 18, wherein said first dielectric layer is a nitride film.

26. The memory cell of claim 18, wherein said second dielectric layer is selected from the group consisting of $Ta_2O_5$, $SrTiO_3$, $Y_2O_3$, $Nb_2O_5$, $ZrO_2$ and titanium oxide.

27. The memory cell of claim 18, wherein said capacitor is a stacked capacitor.

28. The memory cell of claim 18, wherein said capacitor is a container capacitor.

29. The memory cell of claim 18, wherein said cell is a DRAM cell.

30. A DRAM cell having a container capacitor, said capacitor comprising:

a double sided lower electrode formed of a metal wherein an oxide of said metal is conductive;

a first conductive layer in contact with an inner side of said double sided lower electrode in said container capacitor;

a first dielectric layer in contact with said first conductive layer, said first dielectric layer located within the inner side of said double sided electrode;

a second dielectric layer in contact with both an outer side of said double sided lower electrode and said first dielectric layer; and a second conductive layer, wherein said dielectric layers are between said first conductive layer and said second conductive layer.

31. The container capacitor according to claim 30, wherein said first conductive layer is selected from the group consisting of hemispherical grained polysilicon, silica, silicon, germanium, and alloys of silica or germanium.

32. The container capacitor according to claim 30, wherein said second dielectric layer is selected from the group consisting of $Ta_2O_5$, $SrTiO_3$, $Y_2O_3$, $Nb_2O_5$, $ZrO_2$ and titanium oxide.

33. The container capacitor according to claim 30, wherein said first dielectric layer is a silicon nitride layer.

* * * * *